US009286998B1

(12) United States Patent
Singh et al.

(10) Patent No.: US 9,286,998 B1
(45) Date of Patent: Mar. 15, 2016

(54) READ ONLY MEMORY HAVING MULTI-BIT LINE BIT CELL

(71) Applicants: Paramjeet Singh, Delhi (IN);
Manmohan Rana, Ghaziabad (IN)

(72) Inventors: Paramjeet Singh, Delhi (IN);
Manmohan Rana, Ghaziabad (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/525,187

(22) Filed: Oct. 27, 2014

(51) Int. Cl.
*G11C 17/00* (2006.01)
*G11C 17/08* (2006.01)
*G11C 17/12* (2006.01)
*G11C 17/16* (2006.01)
*G11C 11/56* (2006.01)

(52) U.S. Cl.
CPC .............. *G11C 17/08* (2013.01); *G11C 17/12* (2013.01); *G11C 17/126* (2013.01); *G11C 17/16* (2013.01); *G11C 11/5692* (2013.01)

(58) Field of Classification Search
CPC ...... G11C 17/12; G11C 17/16; G11C 17/126; G11C 11/5692
USPC ................. 365/104, 185.13, 185.14
See application file for complete search history.

(56) References Cited

U.S. PATENT DOCUMENTS

| 6,002,607 | A | 12/1999 | Dvir |
| 6,081,456 | A | 6/2000 | Dadashev |
| 6,642,587 | B1 * | 11/2003 | Poplevine ............ G11C 17/123 257/390 |
| 6,648,172 | B2 | 11/2003 | Leighton et al. |
| 6,826,070 | B2 | 11/2004 | Sung et al. |
| 6,975,531 | B2 | 12/2005 | Forbes |
| 7,002,827 | B1 | 2/2006 | Sabharwal et al. |
| 7,075,809 | B2 * | 7/2006 | Jeung .................. G11C 17/126 365/103 |
| 7,179,712 | B2 | 2/2007 | Hoefler |
| 7,215,563 | B2 | 5/2007 | Brandon et al. |
| 7,447,074 | B2 * | 11/2008 | Jacquet .................... G11C 7/18 257/E27.102 |
| 7,936,578 | B2 * | 5/2011 | Nevers ..................... G11C 5/02 365/113 |
| 8,059,442 | B2 | 11/2011 | Alami et al. |
| 8,106,463 | B2 | 1/2012 | Moharir et al. |
| 8,406,031 | B2 | 3/2013 | Buer et al. |
| 8,605,480 | B2 * | 12/2013 | Jain ........................ G11C 17/12 365/104 |
| 2011/0211382 | A1 * | 9/2011 | Sharma .................. G11C 17/18 365/104 |

* cited by examiner

*Primary Examiner* — Pho M Luu
(74) *Attorney, Agent, or Firm* — Charles E. Bergere

(57) ABSTRACT

A memory array includes multiple memory cells, multiple bit lines, multiple word lines, and multiple source lines. Each memory cell includes a corresponding transistor and stores first and second data values. The transistor has corresponding first and second bit lines, and a source line for retrieving the first and second data values. The transistor has a gate terminal connected to a corresponding word line for receiving a word line enable signal, a first diffusion terminal connected to ground, and a second diffusion terminal connected to at least one of the corresponding first bit line, second bit line, and the source line for determining the first and second data values. The second diffusion terminal may be floating for determining the first and second data values.

17 Claims, 12 Drawing Sheets

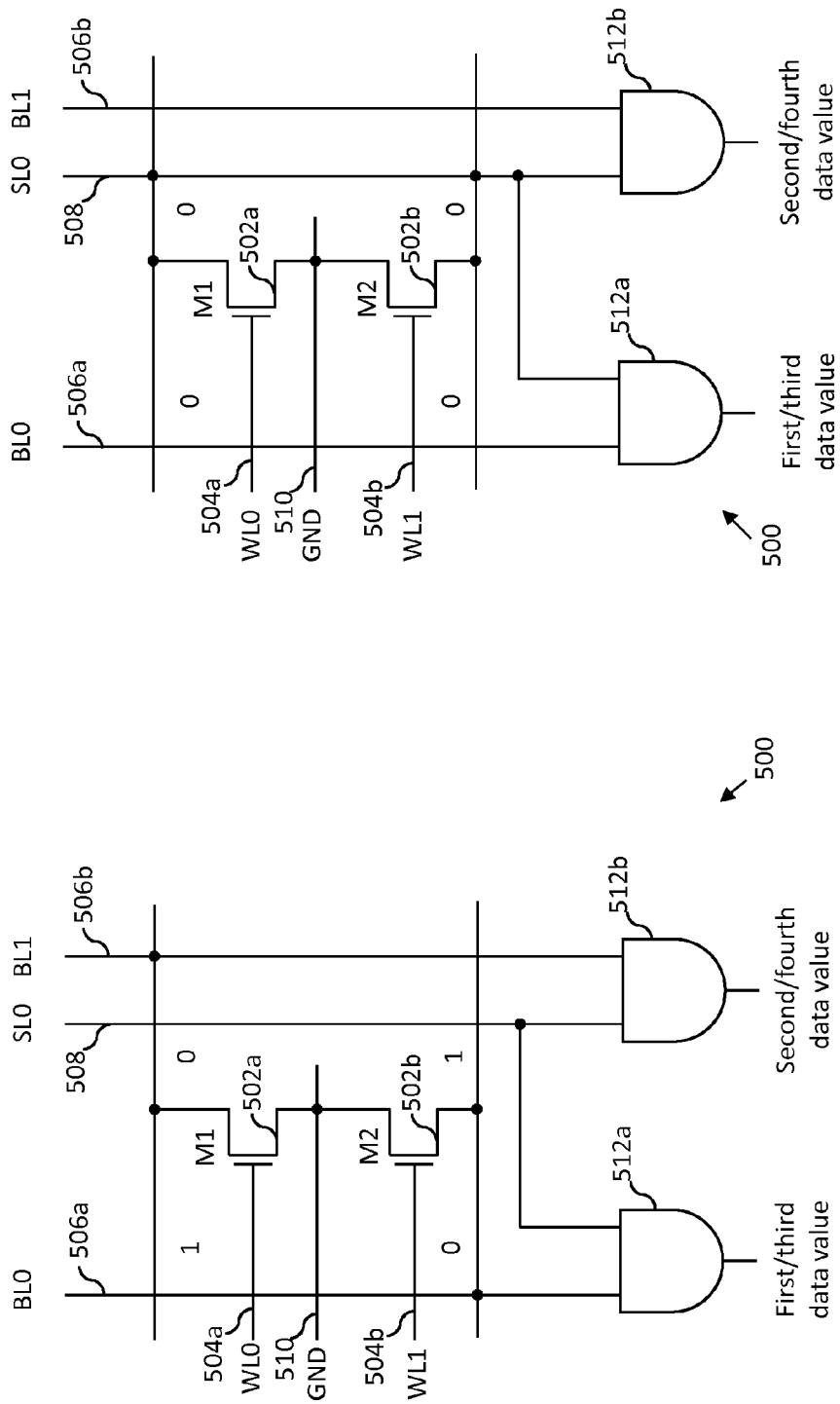

US 9,286,998 B1

READ ONLY MEMORY HAVING MULTI-BIT LINE BIT CELL

BACKGROUND OF THE INVENTION

The present invention generally relates to memory devices, and, more particularly, to a read-only memory (ROM) device with a multi-bit line bit cell.

Memory devices store information such as instructions and data. Non-volatile memory devices retain the stored information even when its power supply is interrupted and hence provide a permanent storage of information. Examples of non-volatile memory devices are ROM, erasable programmable read-only memory (EPROM), and electrically erasable programmable read-only memory (EEPROM) devices. A ROM generally stores firmware and boot code. A mask ROM stores information during the fabrication process. The ROM includes a memory array, an address decoder, a pre-charging unit, a sensing unit, and a column multiplexing unit. The memory array also includes memory cells, bit lines, and word lines.

When a processor connected to the ROM performs a memory read operation, the processor generates first and second binary addresses corresponding to word and bit lines, respectively, to read a memory cell in the memory array. The address decoder receives and decodes the addresses to select the word and bit lines. The address decoder selects a bit line by way of the column multiplexing unit. The column multiplexing unit is connected to the pre-charging and sensing units. During the read operation, the column multiplexing unit selects the pre-charging unit for a predefined time interval. The pre-charging unit charges the bit line to a predefined voltage level and then the column multiplexing unit selects the sensing unit. The sensing unit senses the predefined voltage level of the bit line and determines the data value stored in the memory cell based on the sensed voltage level.

FIG. 1 is a schematic circuit diagram of a conventional ROM array 100. The ROM array 100 is a 2×2 array and includes first through fourth transistors 102a-102d (collectively referred to as transistors 102), first and second bit lines 104a and 104b (collectively referred to as bit lines 104), first and second word lines 106a and 106b (collectively referred to as word lines 106), and first and second ground lines 108a and 108b (collectively referred to as ground lines 108). The transistors 102 form first through fourth memory cells M1, M2, M3, and M4, respectively, and store first through fourth data values, respectively.

Each transistor 102 has a gate terminal, and first and second diffusion terminals. The gate terminals of the first and second transistors 102a and 102b are connected to the first word line 106a and the gate terminals of the third and fourth transistors 102c and 102d are connected to the second word line 106b. The first diffusion terminals of the first and second transistors 102a and 102b are connected to the first ground line 108a, and the second diffusion terminals are connected to the first and second bit lines 104a and 104b for storing the first and second data values in the first and second memory cells M1 and M2. The first diffusion terminal of the third transistor 102c is floating and the second diffusion terminal thereof is connected to the first bit line 104a for storing the third data value in the third memory cell M3. The first diffusion terminal of the fourth transistor 102d is connected to the second ground line 108b and the second diffusion terminal thereof is connected to the second bit line 104b for storing the fourth data value in the fourth memory cell M4. In an example, the first, second, and fourth data values correspond to logic zero and the third data value corresponds to logic one. In another example, the first, second, and fourth data values correspond to logic one and the third data value corresponds to logic zero. The first and second diffusion terminals may be either source or drain terminals.

FIG. 2 is a schematic layout diagram of a conventional ROM array 200. The ROM array 200 is a 2×2 ROM array and represents the ROM array 100 of FIG. 1. The ROM array 200 includes first and second active regions 202a and 202b (collectively referred to as active regions 202) that are formed on a semiconductor substrate 204. First and second gate electrode strips 206a and 206b (collectively referred to as gate electrode strips 206) are formed over the active regions 202. First through eighth metal strips 208a-208h (collectively referred to as metal strips 208) are formed over the active regions 202 and the gate electrode strips 206 by way of and first through seventh contacts 210a-210g (collectively referred to as contacts 210). The first through sixth metal strips 208a-208f are metal 1 metal strips and the seventh and eighth metal strips 208g and 208h are metal 2 metal strips. The first active region 202a includes first through third diffusion regions of which the first and third diffusion regions are source regions and the second diffusion region is a drain region. The second active region 202b includes fourth through sixth diffusion regions of which the fourth and sixth diffusion regions are source regions and the fifth diffusion region is a drain region. The gate electrode strips 206 are polysilicon strips.

The first and second diffusion regions and the first gate electrode strip 206a form a first transistor T1. The fourth and fifth diffusion regions and the first gate electrode strip 206a form a second transistor T2. The second and third diffusion regions and the second gate electrode strip 206b form a third transistor T3. The fifth and sixth diffusion regions and the second gate electrode strip 206b form a fourth transistor T4. The first through fourth transistors T1-T4 correspond to the first through fourth transistors 102a-102d, i.e., the first through fourth memory cells M1, M2, M3, and M4 of the ROM array 100, respectively.

The first metal strip 208a is connected to the first gate electrode strip 206a by way of the first contact 210a. The second metal strip 208b is connected to the second gate electrode strip 206b by way of the second contact 210b. The fifth metal strip 208e is connected to the second diffusion region by way of the third contact 210c. The sixth metal strip 208f is connected to the fifth diffusion region by way of the fourth contact 210d. The first and second metal strips 208a and 208b represent the first and second word lines 106a and 106b, respectively. The seventh and eighth metal strips 208g and 208h represent the first and second bit lines 104a and 104b, respectively. The third and fourth metal strips 208c and 208d represent the first and second ground lines 108a and 108b, respectively.

The first diffusion region is connected to the third metal strip 208c by way of the fifth contact 210e for storing the first data value in the first memory cell M1. The fourth diffusion region is connected to the third metal strip 208c by way of the sixth contact 210f for storing the second data value in the second memory cell M2. The third diffusion region is kept floating for storing the third data value in the third memory cell M3. The sixth diffusion region is connected to the fourth metal strip 208d by way of the seventh contact 210g for storing the fourth data value in the fourth memory cell M4. This technique of storing the first through fourth data values is referred to as contact programming.

In operation, to read the first data value stored in the first memory cell M1, a pre-charging unit (not shown) pre-charges the first bit line 104a to a first voltage level for a predefined time interval. Thereafter, an address decoder (not shown) activates the first word line 106a for a predefined time interval, which switches on the first transistor 102a. Since the first diffusion terminal of the first transistor 102a is connected to the first ground line 108a and the second diffusion terminal of the first transistor 102a is connected to the first bit line 104a, the first bit line 104a is discharged to ground by way of the first transistor 102a. Subsequently, a sensing unit (not shown) senses the first bit line 104a, detects a low voltage, and reads the first data value as logic zero. The read operation of the second through fourth memory cells M2-M4 is performed in a similar manner.

FIG. 3 is a schematic circuit diagram of another conventional ROM array 300. The ROM array 300 is a 2×2 ROM array and includes first through fourth transistors 302a-302d (collectively referred to as transistors 302), first and second bit lines 304a and 304b (collectively referred to as bit lines 304), first and second word lines 306a and 306b (collectively referred to as word lines 306), and a ground line 308. The first through fourth transistors 302a-302d form first through fourth memory cells M1, M2, M3, and M4, and store first through fourth data values, respectively.

Each transistor 302 has a gate terminal, and first and second diffusion terminals. The gate terminals of the first and second transistors 302a and 302b are connected to the first word line 306a and the gate terminals of the third and fourth transistors 302c and 302d are connected to the second word line 306b. The first diffusion terminals of the first and second transistors 302a and 302b are connected to the ground line 308, and the second diffusion terminals of the first and second transistors 302a and 302b are connected to the first and second bit lines 304a and 304b for storing the first and second data values in the first and second memory cells M1 and M2, respectively. The first diffusion terminal of the third transistor 302c is connected to the ground line 308 and the second diffusion terminal thereof is floating for storing the third data value in the third memory cell M3. The first diffusion terminal of the fourth transistor 302d is connected to the ground line 308 and the second diffusion terminal is connected to the second bit line 304b for storing the fourth data value in the fourth memory cell M4. The first and second diffusion terminals may be either source or drain terminals.

FIG. 4 is a schematic layout diagram of a conventional 2×2 ROM array 400, which represents the ROM array 300 of FIG. 3. The ROM array 400 includes first and second active regions 402a and 402b (collectively referred to as active regions 402) formed on a semiconductor substrate 404. First and second gate electrode strips 406a and 406b (collectively referred to as gate electrode strips 406) are formed over the active regions 402. First through eleventh metal strips 408a-408k (collectively referred to as metal strips 408) are formed over the active regions 402 and the gate electrode strips 406 by way of first through eighth contacts 410a-410h (collectively referred to as contacts 410), and first through fifth vias 412a-412e (collectively referred to as vias 412). The first through seventh metal strips 208a-208g are metal 1 metal strips and the eighth through eleventh metal strips 208h-208k are metal 2 metal strips. The first active region 402a includes first through third diffusion regions of which the first and third diffusion regions are drain regions and the second diffusion region is a source region. The second active region 402b includes fourth through sixth diffusion regions of which the fourth and sixth diffusion regions are drain regions and the fifth diffusion region is a source region. The gate electrode strips 406 are polysilicon strips.

The first and second diffusion regions and the first gate electrode strip 406a form a first transistor T1. The fourth and fifth diffusion regions and the first gate electrode strip 406a form a second transistor T2. The second and third diffusion regions and the second gate electrode strip 406b form a third transistor T3. The fifth and sixth diffusion regions and the second gate electrode strip 406b form a fourth transistor T4. The first through fourth transistors T1-T4 correspond to the first through fourth transistors 302a-302d, i.e., first through fourth memory cells M1, M2, M3, and M4 of the ROM array 300.

The tenth metal strip 408j is connected to the first gate electrode strip 406a by way of the first via 412a, the first metal strip 408a, and the first contact 410a. The eleventh metal strip 408k is connected to the second gate electrode strip 406b by way of the second via 412b, the second metal strip 408b and the second contact 410b. The third metal strip 408c is connected to the second and fifth diffusion regions by way of the fourth and seventh contacts 410d and 410g, respectively. The fourth metal strip 408d is connected to the first diffusion region by way of the third contact 410c. The fifth metal strip 408e is connected to the fourth diffusion region by way of the sixth contact 410f. The sixth metal strip 408f is connected to the third diffusion region by way of the fifth contact 410e. The seventh metal strip 408g is connected to the sixth diffusion region by way of the eighth contact 410h. The tenth and eleventh metal strips 408j and 408k represent the first and second word lines 306a and 306b, respectively. The eighth and ninth metal strips 408h and 408i represent the first and second bit lines 304a and 304b, respectively. The third metal strip 408c represents the ground line 308.

The fourth metal strip 408d is connected to the eighth metal strip 408h by way of the third via 412c for storing the first data value in the first memory cell M1. The fifth metal strip 408e is connected to the ninth metal strip 408i by way of the fourth via 412d for storing the second data value in the second memory cell M2. The sixth metal strip 408f is kept floating for storing the third data value in the third memory cell M3. The seventh metal strip 408g is connected to the ninth metal strip 408i by way of the fifth via 412e for storing the fourth data value in the fourth memory cell M4. This technique of storing the first through fourth data values is referred to as via programming.

In operation, to read the first data value stored in the first memory cell M1, a pre-charging unit (not shown) pre-charges the first bit line 304a to a first voltage level for a predefined time interval. Thereafter, an address decoder (not shown) activates the first word line 306a for a predefined time interval, which switches on the first transistor 302a. Since the second diffusion terminal of the first transistor 302a is connected to the first bit line 304a and the first diffusion terminal of the first transistor 302a is connected to the ground line 308, the first bit line 304a is discharged to ground by way of the first transistor 302a. Subsequently, a sensing unit (not shown) senses the first bit line 304a, detects a low voltage corresponding to logic zero and reads the first data value as logic zero. The read operation of the second through fourth memory cells M2-M4 is performed in a similar manner.

Over the years, the requirement of increased storage capacity in ROM arrays has escalated. With advancements in semiconductor fabrication processes, miniaturization of electronic components such as transistors has also increased. Since each transistor stores a single data value, generally, the storage capacity is increased by increasing the number of memory cells, i.e., by increasing the number of transistors. However, process variations such as variations in length or width of a transistor, doping and other device parameters increase with the miniaturization of the transistors. Process variations are inversely proportional to the width and length of the transistors, and directly proportional to the number of the transistors. Thus, a ROM array with more transistors with each transistor having a reduced width for improved storage capacity has high process variations. This increase in the process variations results in a reduced yield of the fabrication process. Further, there is a significant degradation in the performance of the ROM array because the process variations weaken the memory cell. Designers must take into account the weak memory cells for timing closure that results in increased access time of the ROM array. Further, it takes longer to fabricate ROM arrays by contact programming because the metal layers such as metal 1, metal 2, and so on, and via layers are fabricated after the data values to be stored in the ROM array are determined.

Therefore, it would be advantageous to have a ROM array that has increased storage density and improved read access time, reduced power consumption and that generally overcomes the aforementioned limitations of the conventional ROM arrays.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIGS. 5A, 5B, 5C, and 5D are schematic circuit diagrams of a ROM array in accordance with an embodiment of the present invention;

DETAILED DESCRIPTION

Figure 1:
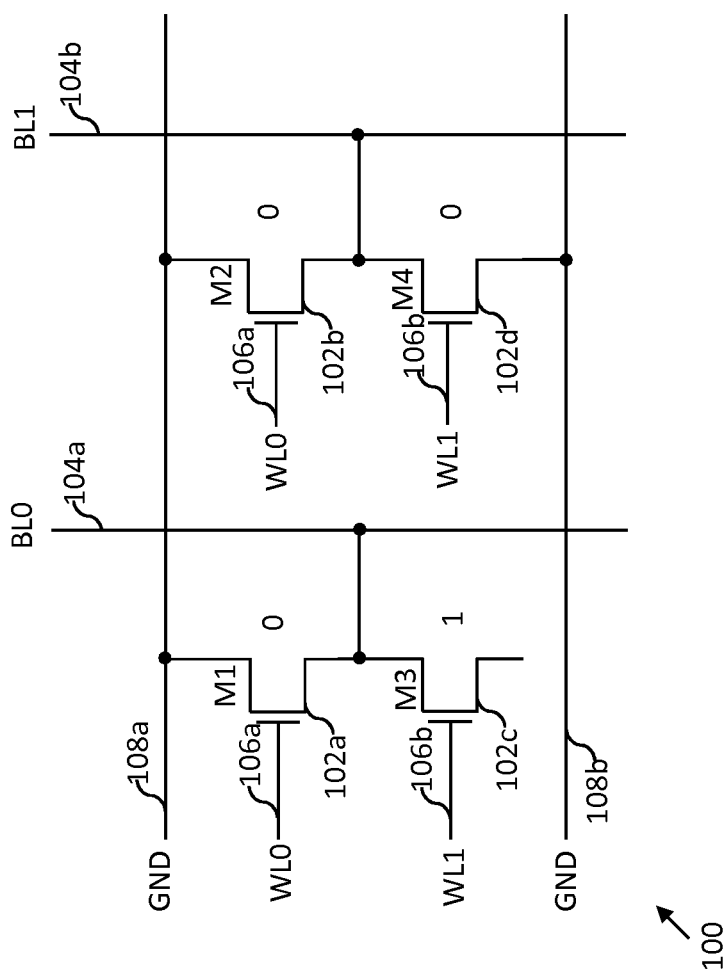
FIG. 1 is a schematic circuit diagram of a conventional ROM array.
Figure 2:
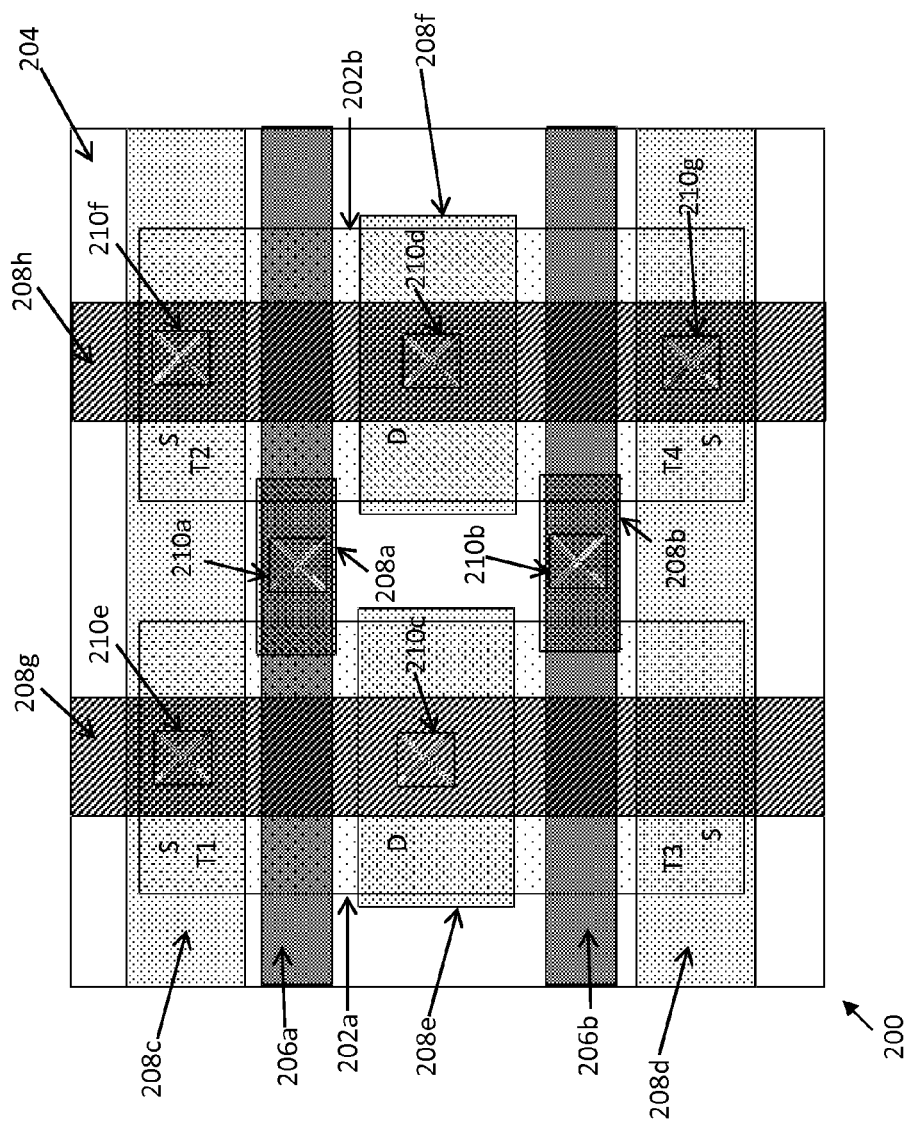
FIG. 2 is a schematic layout diagram of the conventional ROM array of FIG. 1.
Figure 3:
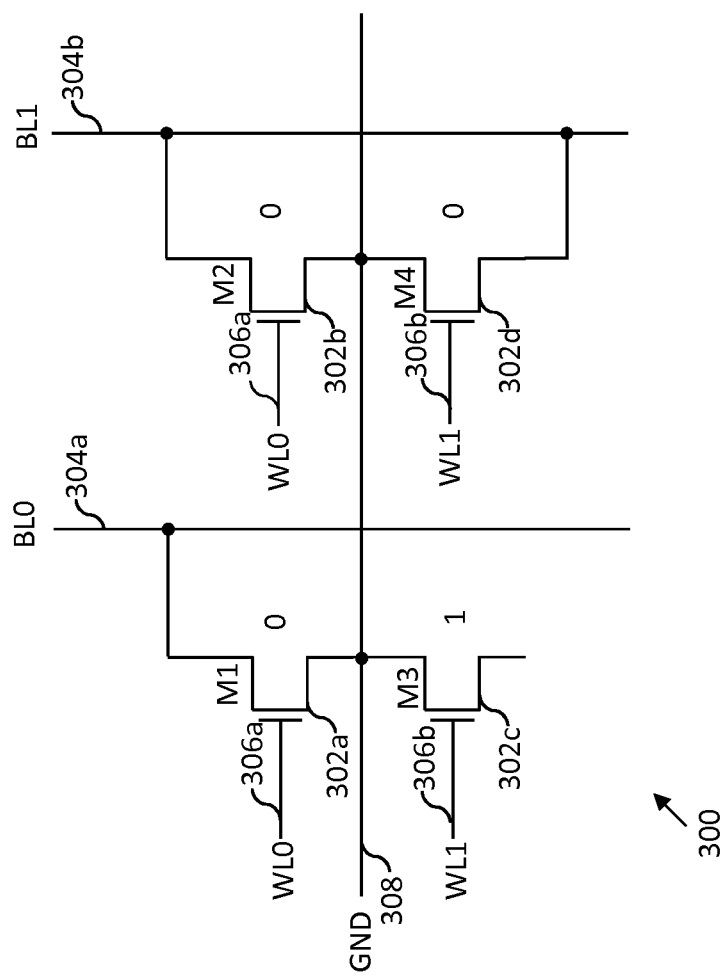
FIG. 3 is a schematic circuit diagram of another conventional ROM array.
Figure 4:
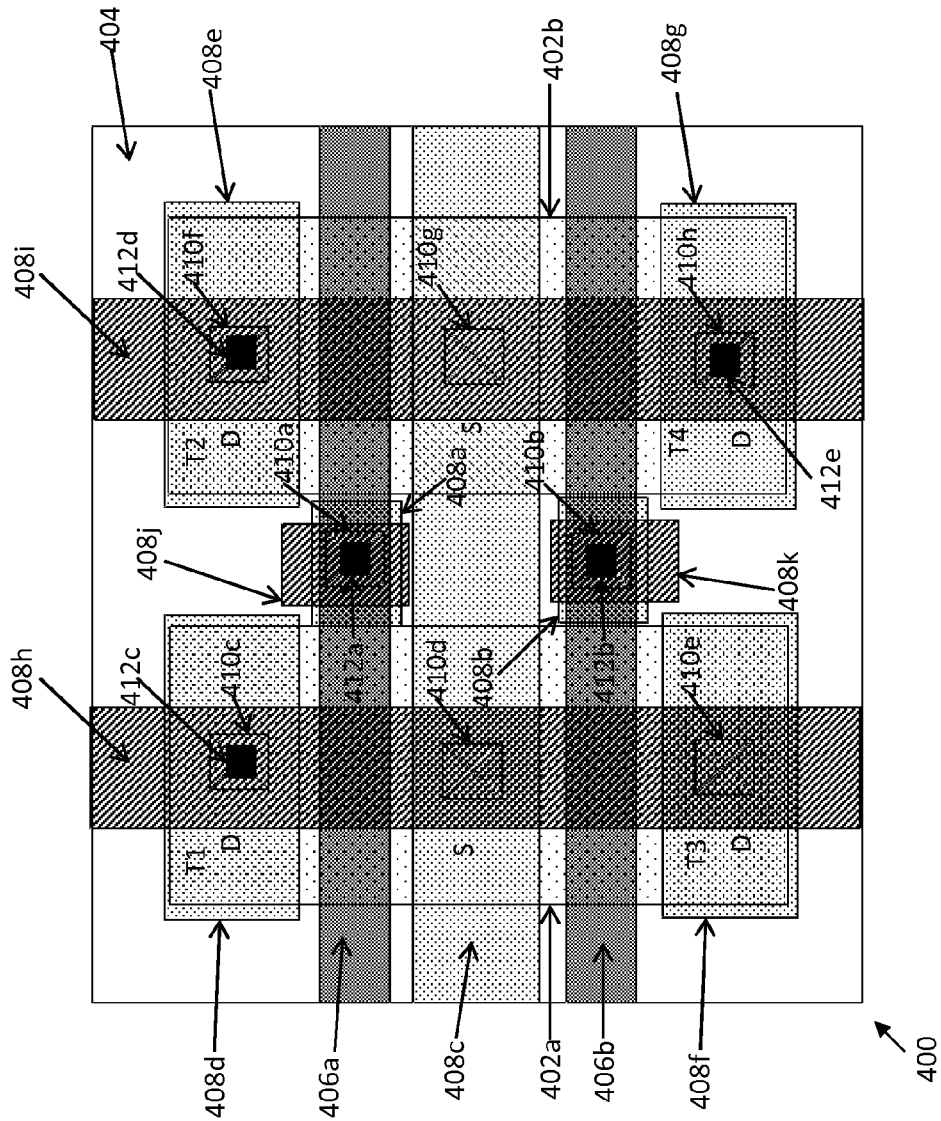
FIG. 4 is a schematic layout diagram of the conventional ROM array of FIG. 3.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a memory device is provided. The memory device includes a plurality of memory cells including a corresponding plurality of transistors, a plurality of word lines, a plurality of bit lines, and a plurality of source lines, where a first memory cell includes a first transistor. The first transistor stores first and second data values. A first word line activates the first transistor. A first pair of bit lines corresponds to the first transistor and includes first and second bit lines. The first and second bit lines retrieve the first and second data values, respectively. A first source line corresponds to the first transistor and retrieves the first and second data values. The first transistor has a gate terminal connected to the first word line for receiving a word line enable signal, a first diffusion terminal connected to ground, and a second diffusion terminal connected to at least one of the first source line, and the first and second bit lines, for determining the first and second data values.

In another embodiment of the present invention, a memory device is provided. The memory device includes a plurality of memory cells including a corresponding plurality of transistors, a plurality of word lines, a plurality of pairs of bit lines, and a plurality of source lines. A first memory cell of the plurality of memory cells includes a first transistor of the plurality of transistors. The first transistor is configured to store first, second, third, and fourth data values. A first word line of the plurality of word lines activates the first transistor. A first pair of bit lines of the plurality of pairs of bit lines corresponds to the first transistor and includes first and second bit lines. A second pair of bit lines of the plurality of pairs of bit lines corresponds to the first transistor and includes third and fourth bit lines. The first, second, third, and fourth bit lines are configured to retrieve the first, second, third, and fourth data values, respectively. A first source line of the plurality of source lines corresponds to the first transistor and is configured to retrieve the first and second data values. A second source line of the plurality of source lines corresponds to the first transistor and is configured to retrieve the third and fourth data values. The first transistor has a gate terminal connected to the first word line for receiving a word line enable signal, a first diffusion terminal connected to ground, and a second diffusion terminal connected to at least one of the first source line, the second source line, the first bit line, the second bit line, the third bit line, and the fourth bit line, for determining the first, second, third, and fourth data values.

In yet another embodiment of the present invention, layout of a memory device is provided. The memory device includes a plurality of active regions formed on a semiconductor substrate. A plurality of gate electrode strips are formed over the plurality of active regions. First through sixth metal strips are formed over the plurality of active regions and the plurality of gate electrode strips. A first active region of the plurality of active regions includes first and second diffusion regions. A first gate electrode strip of the plurality of gate electrode strips is formed over the first active region, such that the first gate electrode strip, and the first and second diffusion regions form a first transistor. The first transistor stores first and second data values. The first metal strip is connected to the first gate electrode strip. The first gate electrode strip receives a first voltage signal by way of the first metal strip for reading the first and second data values. The second metal strip is connected to ground. The first diffusion region is connected to ground by way of the second metal strip. The third metal strip is connected to the second diffusion region. The second diffusion region is connected to at least one of the fourth, fifth, and sixth metal strips by way of the third metal strip for receiving a second voltage signal for determining the first and second data values.

Various embodiments of the present invention provide a memory device. The memory device includes multiple memory cells, multiple word lines, multiple bit lines, and multiple source lines. Each memory cell has corresponding first and second bit lines, and a source line for retrieving the first and second data values. The multiple memory cells that include corresponding multiple transistors form a ROM array. Each transistor has a gate terminal connected to the corresponding word line for receiving a word line enable signal, a first diffusion terminal connected to ground, and a second diffusion terminal connected to at least one of a corresponding first bit line, a second bit line, and a source line for storing the first and second data values. Further, the second diffusion terminal may be kept floating for storing the first and second data values. In an embodiment of the present invention, a memory device layout of the aforementioned memory device is provided. First and second diffusion regions and a corresponding gate electrode strip form a transistor. The gate electrode strip is connected to a first metal strip by way of a contact. Second and third metal strips are connected to the first and second diffusion regions, respectively, by way of contacts. The third metal strip is connected to at least one of fourth, fifth, and sixth metal strips for storing the first and second data values. Further, the third metal strip may be kept floating for storing the first and second data values. The fourth and sixth metal strips form bit lines and the fifth metal strip forms a source line. The bit lines and the source line retrieve the first and second data values. Thus, each memory cell stores at least two data values. In accordance with the present invention, the memory cell may store four, six, eight, and so on data values. As a single memory cell stores multiple data values, the storage density of the ROM array is significantly improved. Further, for a predefined storage capacity, the number of memory cells in the ROM array is reduced, thereby reducing the impact of process variations. Moreover, the increase in the width of each transistor reduces the incidence of process variations. As a result, the overall performance of the ROM array improves with improved timing margins and read access time along with reduction in the ROM array area.

Referring now to FIGS. 5A-5D, a schematic circuit diagram of a ROM array 500 in accordance with an embodiment of the present invention is shown. The ROM array 500 is a 2×2 ROM array and includes first and second transistors 502*a* and 502*b* (collectively referred to as transistors 502), first and second word lines 504*a* and 504*b* (collectively referred to as word lines 504), first and second bit lines 506*a* and 506*b* (collectively referred to as bit lines 506), a source line 508, a ground line 510, and a sensing unit 511. The sensing unit 511 includes first and second gates 512*a* and 512*b*. The first and second transistors 502*a* and 502*b* form first and second memory cells M1 and M2, and are configured to store first and second data values, and third and fourth data values, respectively. The first and second gates 512*a* and 512*b* are AND gates 512*a* and 512*b*, respectively, (collectively referred to as AND gates 512). The sensing unit 511 may include NAND, NOR, XOR, NOT, and XNOR gates.

Each transistor 502 has a gate terminal, and first and second diffusion terminals. In an embodiment of the present invention, the first diffusion terminal is a source terminal and the second diffusion terminal is a drain terminal. It is well known in the art that the first and second diffusion terminals may be drain and source terminals, respectively. The gate terminals of the first and second transistors 502*a* and 502*b* are connected to the first and second word lines 504*a* and 504*b*, respectively. The first diffusion terminals of the first and second transistors 502*a* and 502*b* are connected to the ground line 510. The second diffusion terminals of the first and second transistors 502*a* and 502*b* are either connected to at least one of the source line 508, and the first and second bit lines 506*a* and 506*b* or are kept floating for storing the first and second data values, and the third and fourth data values in the first and second memory cell M1 and M2, respectively. Each AND gate 512 has first and second input terminals, and an output terminal. The first and second input terminals of the first AND gate 512*a* are connected to the first bit line 506*a* and the source line 508, respectively. The first and second input terminals of the second AND gate 512*b* are connected to the source line 508 and the second bit line 506*b*, respectively.

FIG. 5A shows that the second diffusion terminal of the first transistor 502*a* is connected to the second bit line 506*b* for storing the first and second data values in the first memory cell M1. The second diffusion terminal of the second transistor 502*b* is connected to the first bit line 506*a* for storing the third and fourth data values in the second memory cell M2. In an example, the first and fourth data values correspond to logic one and the second and third data values correspond to logic zero. It will be apparent to those skilled in the art that when the sensing unit 511 includes NAND gates instead of the AND gates 512, the first and fourth data values correspond to logic zero and the second and third data values correspond to logic one. Thus, the sensing unit 511 determines the logic value of the first, second, third, and fourth data values.

FIG. 5B shows that the second diffusion terminal of the first transistor 502*a* is connected to the source line 508 for storing the first and second data values in the first memory cell M1. The second diffusion terminal of the second transistor 502*b* is connected to the source line 508 for storing the third and fourth data values in the second memory cell M2. In FIG. 5B, the first, second, third, and fourth data values correspond to logic zero. It will be apparent to those skilled in the art that when the sensing unit 511 includes NAND gates instead of the AND gates 512, the first, second, third, and fourth data values correspond to logic one.

Figure 5D:
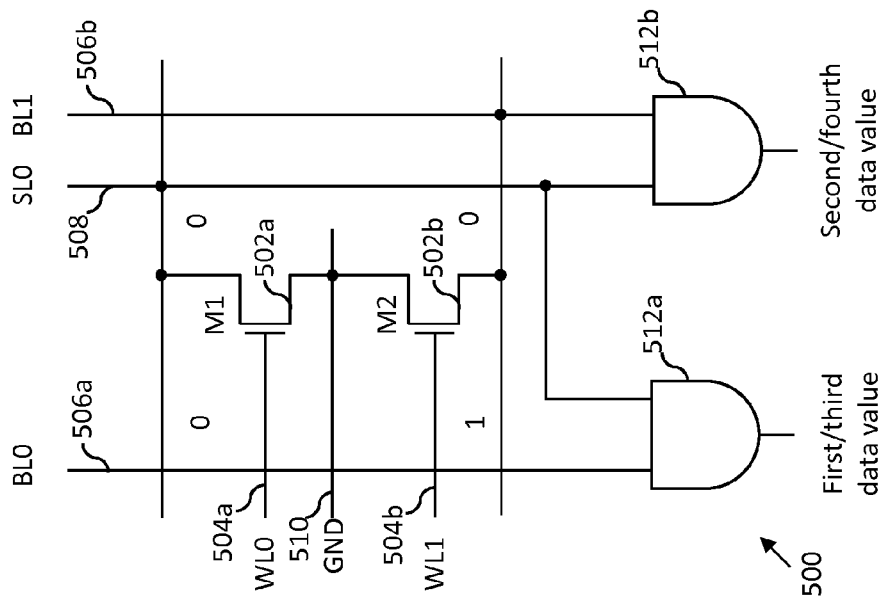
Figure 5C:
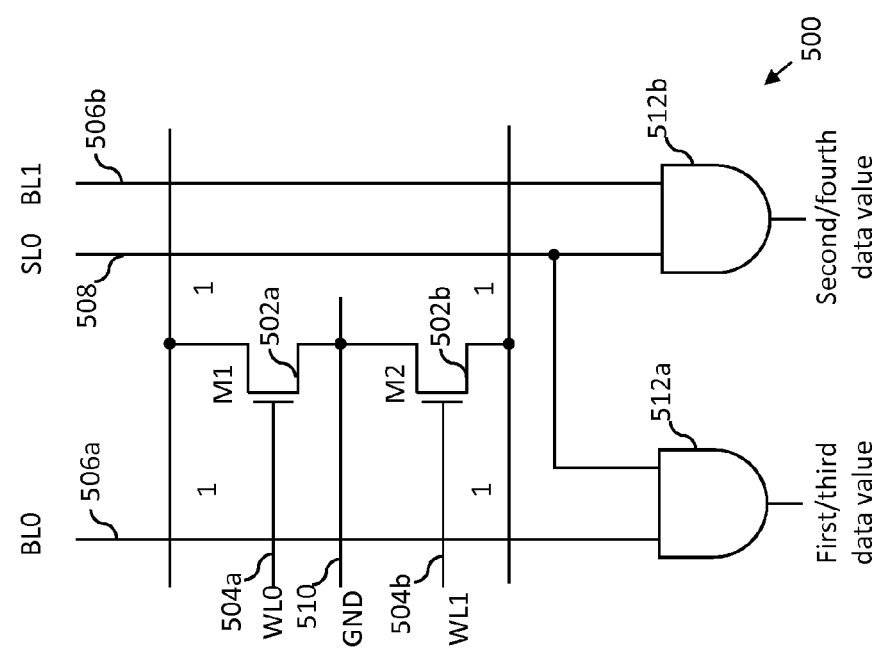

FIG. 5C shows that the second diffusion terminal of the first transistor 502*a* is floating for storing the first and second data values in the first memory cell M1. The second diffusion terminal of the second transistor 502*b* is floating for storing the third and fourth data values in the second memory cell M2. In FIG. 5C, the first, second, third, and fourth data values correspond to logic one. It will be apparent to those skilled in the art that when the sensing unit 511 includes NAND gates instead of the AND gates 512, the first, second, third, and fourth data values correspond to logic zero.

FIG. 5D shows that the second diffusion terminal of the first transistor 502*a* is connected to the source line 508 for storing the first and second data values in the first memory cell M1. The second diffusion terminal of the second transistor 502*b* is connected to the second bit line 506*b* for storing the third and fourth data values in the second memory cell M2. In FIG. 5D, the first, second, and fourth data values correspond to logic zero and the third data value corresponds to logic one. It will be apparent to those skilled in the art that when the sensing unit 511 includes NAND gates instead of the AND gates 512, the first, second, and fourth data values correspond to logic one and the third data value corresponds to logic zero.

Figure 6A:
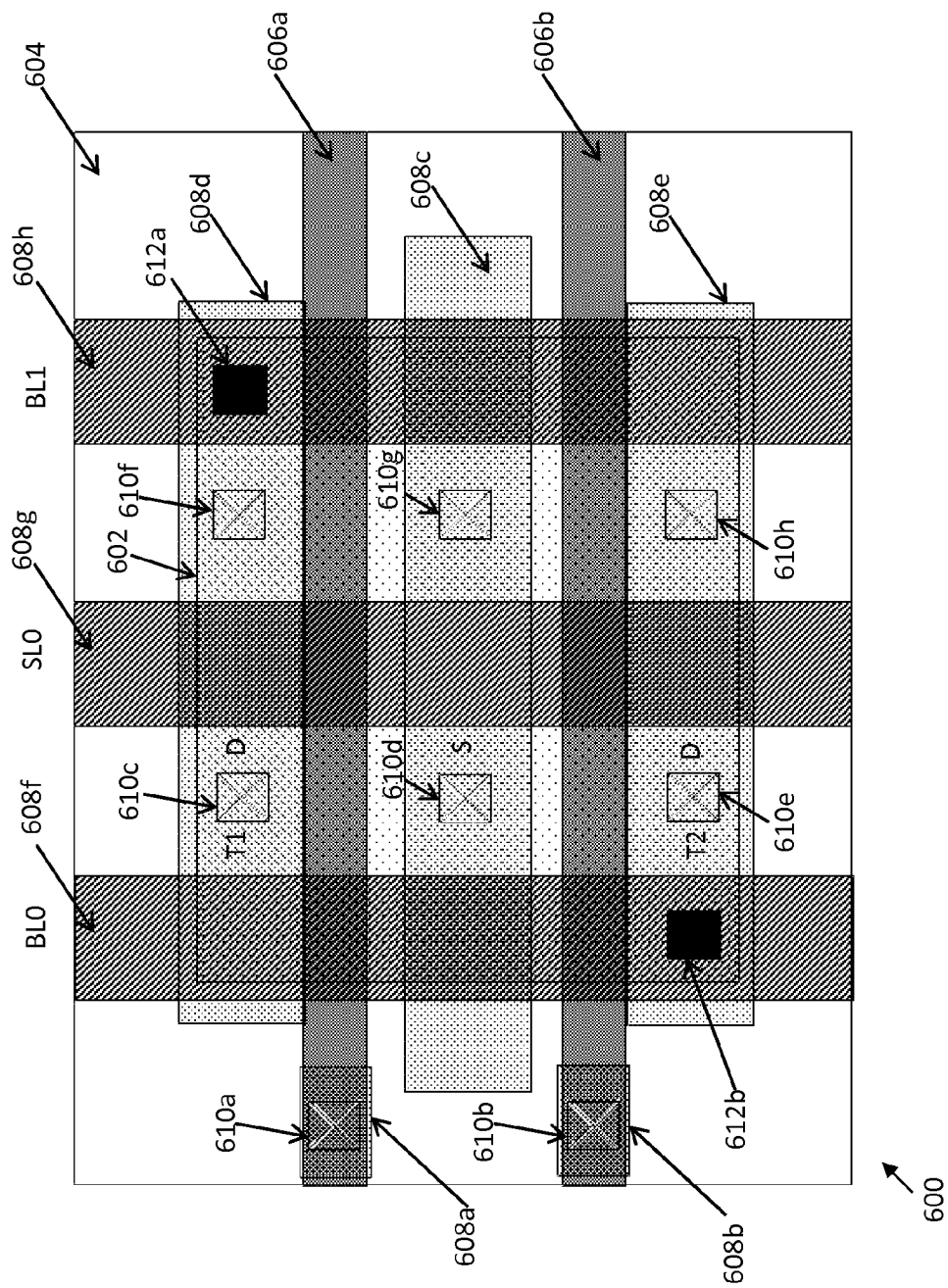
FIGS. 6A, 6B, 6C, and 6D are schematic layout diagrams of the ROM array of FIGS. 5A, 5B, 5C, and 5D, respectively in accordance with an embodiment of the present invention.
Figure 6B:
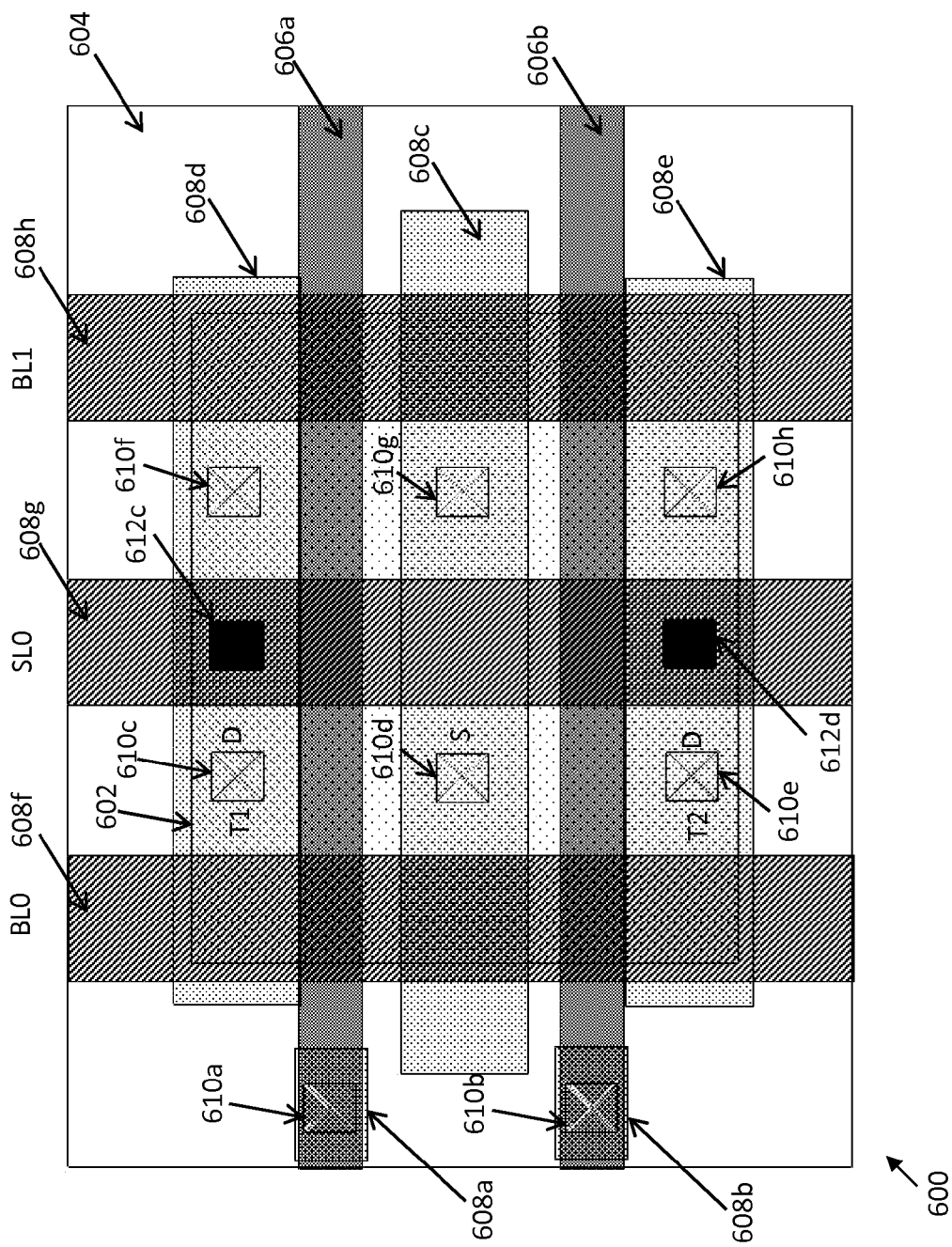
Figure 6C:
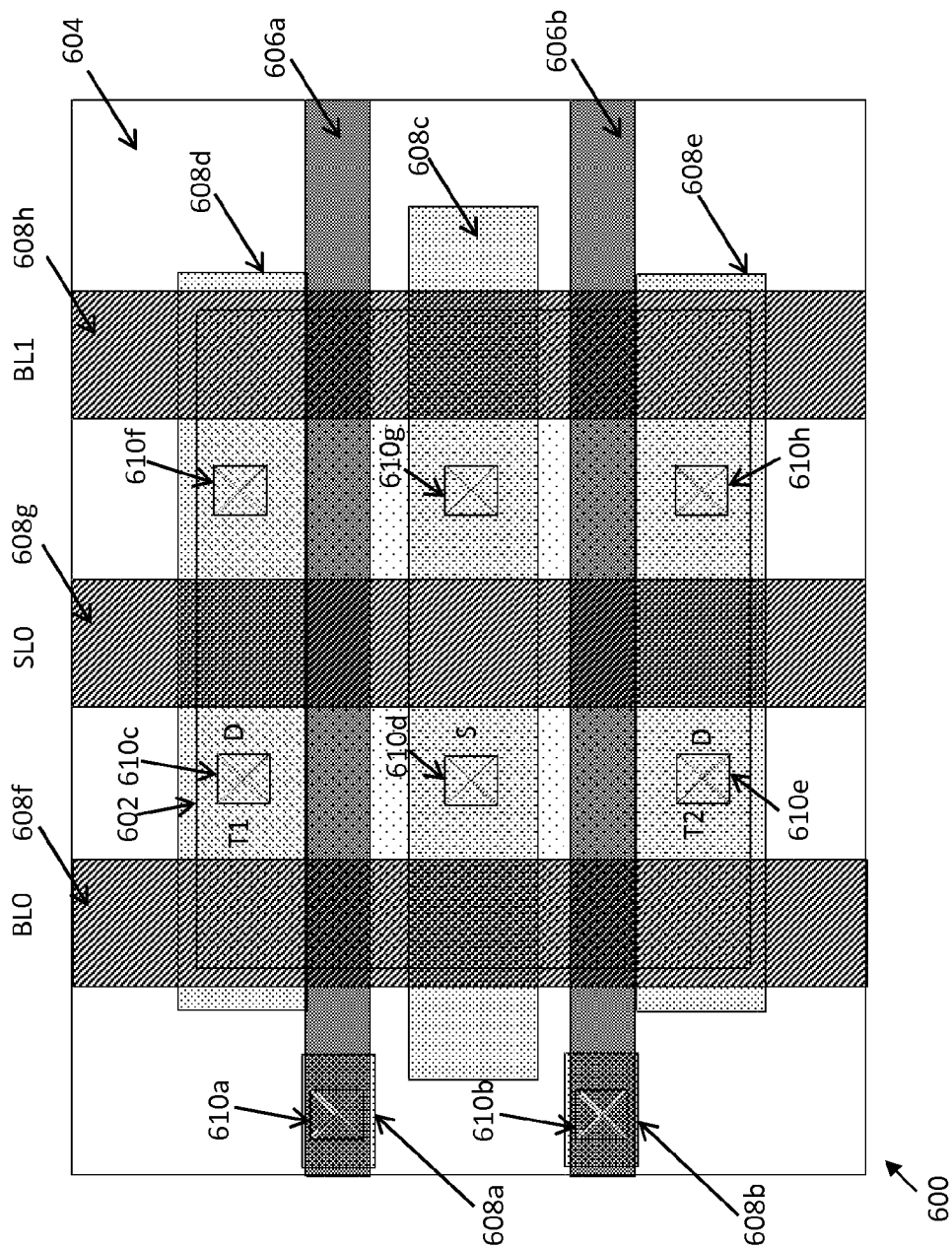
Figure 6D:
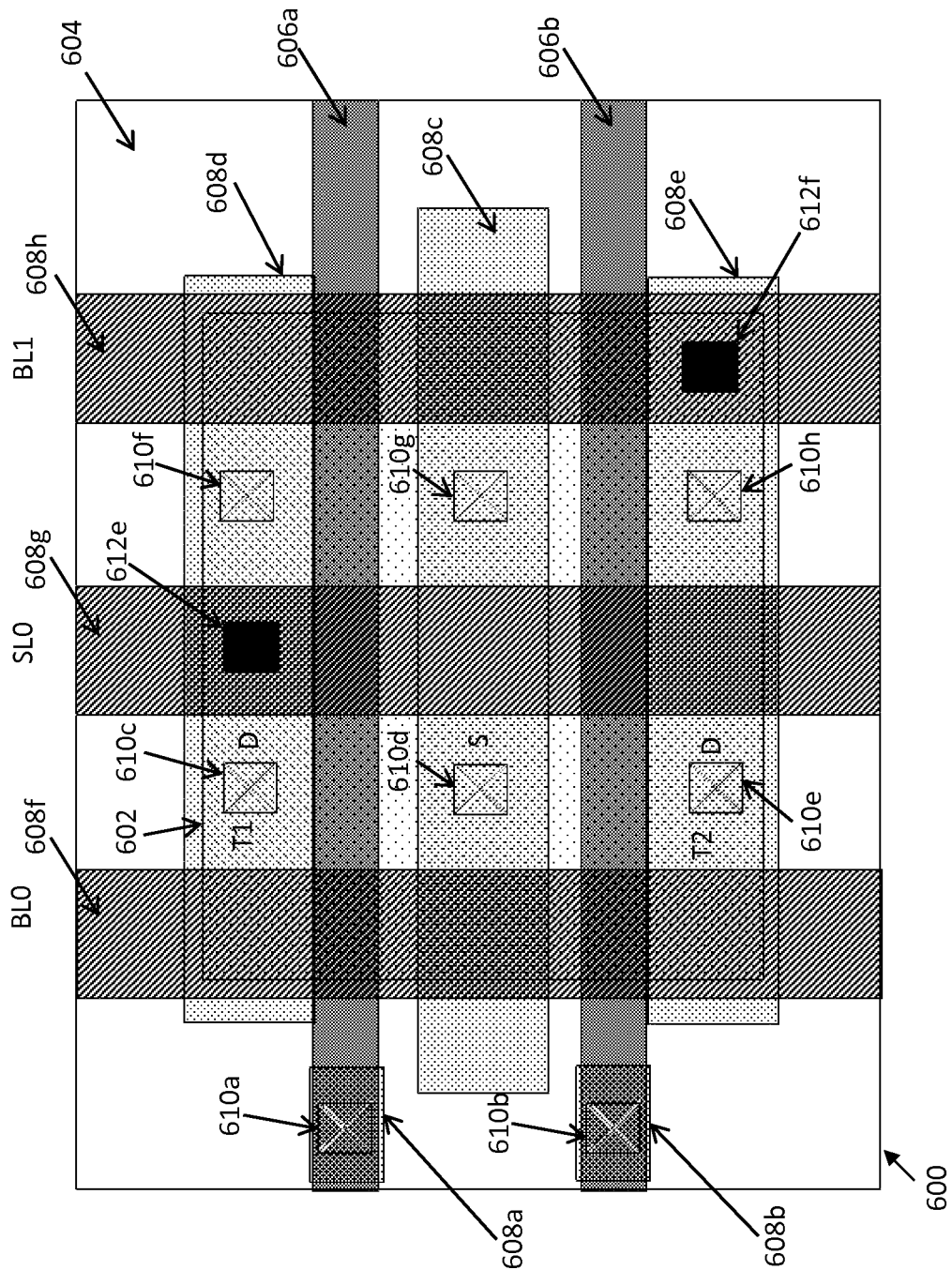

Referring now to FIGS. 6A-6D, a schematic layout of a ROM array 600 in accordance with an embodiment of the present invention is shown. The ROM array 600 is a 2×2 ROM array and the ROM array 600 of FIGS. 6A-6D represents the ROM array 500 of FIGS. 5A-5D, respectively. The ROM array 600 includes an active region 602 formed on a semiconductor substrate 604. First and second gate electrode strips 606*a* and 606*b* (collectively referred to as gate electrode strips 606) are formed over the active region 602. First through eighth metal strips 608*a*-608*h* (collectively referred to as metal strips 608) are formed over the active region 602 and the gate electrode strips 606 by way of first through eighth contacts 610*a*-610*h* (collectively referred to as contacts 610). The ROM array 600 includes first and second vias 612*a* and 612*b* as shown in FIG. 6A, third and fourth vias 612*c* and 612*d* as shown in FIG. 6B, and fifth and sixth vias 612*e* and 612*f* as shown in FIG. 6D. The active region 602 includes first through third diffusion regions. The metal strips 608a-608e are first metal strips and the metal strips 608f-608h are second metal strips. It is well known in the art that the metal strips 608 may include any one of metal 1, metal 2, and so on types of metal strips.

The first and second diffusion regions, and the first gate electrode strip 606a form a first transistor T1. The second and third diffusion regions, and the second gate electrode strip 606b form a second transistor T2. The first and second transistors T1 and T2 correspond to the first and second transistors 502a and 502b, i.e., the first and second memory cells M1 and M2 of the ROM array 500 of FIGS. 5A-5D, respectively. The first transistor T1 is configured to store the first and second data values and the second transistor T2 is configured to store the third and fourth data values. The first metal strip 608a is connected to the first gate electrode strip 606a by way of the first contact 610a. The second metal strip 608b is connected to the second gate electrode strip 606b by way of the second contact 610b. The third metal strip 608c is connected to the second diffusion region by way of the fourth and seventh contacts 610d and 610g. The fourth metal strip 608d is connected to the first diffusion region by way of the third and sixth contacts 610c and 610f. The fifth metal strip 608e is connected to the third diffusion region by way of the fifth and eighth contacts 610e and 610h. The first metal strip 608a represents the first word line 504a of the ROM array 500. The second metal strip 608b represents the second word line 504b of the ROM array 500. The third metal strip 608c represents the ground line 510 of the ROM array 500. The sixth and eighth metal strips 608f and 608h represent the first and second bit lines 506a and 506b of the ROM array 500, respectively. The seventh metal strip 608g represents the source line 508 of the ROM array 500. FIG. 6A shows that the fourth metal strip 608d is connected to the eighth metal strip 608h by way of the via 612a for storing the first and second data values in the first memory cell M1. The fifth metal strip 608e is connected to the sixth metal strip 608f by way of the via 612b for storing the third and fourth data values in the second memory cell M2.

FIG. 6B shows that the fourth metal strip 608d is connected to the seventh metal strip 608g by way of the via 612c for storing the first and second data values in the first memory cell M1. The fifth metal strip 608e is connected to the seventh metal strip 608g by way of the via 612d for storing the third and fourth data values in the second memory cell M2.

FIG. 6C shows that the fourth metal strip 608d is floating for storing the first and second data values in the first memory cell M1. The fifth metal strip 608e is kept floating for storing the third and fourth data values in the second memory cell M2. As the fourth and fifth metal strips 608d and 608e are floating, via programming is not required.

FIG. 6D shows that the fourth metal strip 608d is connected to the seventh metal strip 608g by way of the via 612e for storing the first and second data values in the first memory cell M1. The fifth metal strip 608e is connected to the eighth metal strip 608h by way of the via 612f for storing the third and fourth data values in the second memory cell M2.

In an example, a word includes two data values. The first and second data values form a first word and the third and fourth data values form a second word. In operation, to read the first word stored in the first memory cell M1 of FIG. 5A, a processor (not shown) generates and provides an address of the first word to an address decoding unit (not shown). The address decoding unit identifies the bit lines 506, the source line 508 and the first word line 504a. The address decoding unit selects the bit lines 506 and the source line 508. The pre-charging unit pre-charges the bit lines 506 and the source line 508 to a first voltage level for a predefined time interval. Thereafter, the address decoding unit activates the first word line 504a for a predefined time interval, which switches on the first transistor 502a. As the first diffusion terminal of the first transistor 502a is connected to the ground line 510 and the second diffusion terminal thereof is connected to the second bit line 506b, the second bit line 506b is discharged to ground by way of the first transistor 502a. As the second diffusion terminal of the first transistor 502a is not connected to either of the first bit line 506a or the source line 508, the first bit line 506a and the source line 508 are not discharged to ground. The first AND gate 512a detects a high voltage on the first bit line 506a and the first source line 508, and hence outputs the first data value as logic one. The second AND gate 512b detects a low voltage on the second bit line 506b and a high voltage on the source line 508, and hence outputs the second data value as logic zero. The read operation for reading at least one of the first and second data values stored in the first memory cell M1 of FIGS. 5B, 5C, and 5D is performed in a similar manner. Similarly, at least one of the third and fourth data values is read from the second memory cell M2 of FIGS. 5A-5D.

Figure 7:
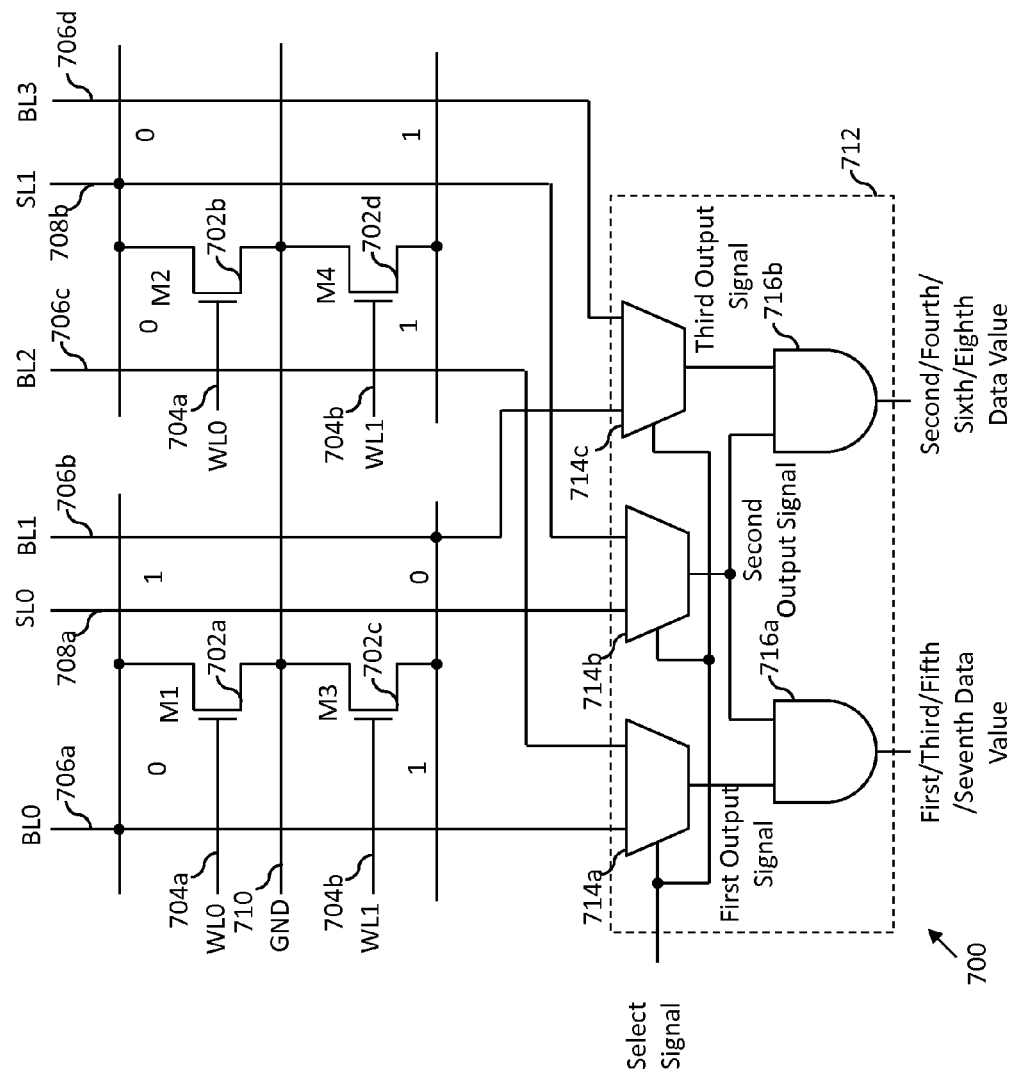
FIG. 7 is a schematic circuit diagram of a ROM array in accordance with an embodiment of the present invention.

Referring now to FIG. 7, a schematic circuit diagram of a ROM array 700 in accordance with another embodiment of the present invention is shown. The ROM array 700 is a 2×4 ROM array and includes first through fourth transistors 702a-702d (collectively referred to as transistors 702), first and second word lines 704a and 704b (collectively referred to as word lines 704), first through fourth bit lines 706a-706d (collectively referred to as bit lines 706), first and second source lines 708a and 708b (collectively referred to as source lines 708), a ground line 710, and a column multiplexing unit 712. The column multiplexing unit 712 includes first through third multiplexers 714a-714c or muxes 714a-714c (collectively referred to as muxes 714), and a sensing unit 715. The sensing unit 715 includes first and second gates 716a and 716b. The first through fourth transistors 702a-702d form first through fourth memory cells M1, M2, M3, and M4, respectively. The first transistor 702a stores first and second data values. The second transistor 702b stores third and fourth data values. The third transistor 702c stores store fifth and sixth data values. The fourth transistor 702d stores seventh and eighth data values. The first bit line 706a retrieves the first and fifth data values. The second bit line 706b retrieves the second and sixth data values. The third bit line 706c retrieves the third and seventh data values. The fourth bit line 706d retrieves the fourth and eighth data values. The first source line 708a retrieves the first, second, fifth, and sixth data values. The second source line 708b retrieves the third, fourth, seventh, and eighth data values. The first and second gates 716a and 716b are AND gates 716a and 716b, respectively, (collectively referred to as AND gates 716). It is well known in the art that the sensing unit 715 may include NAND, NOR, XOR, NOT, and XNOR gates.

Each transistor 702 has a gate terminal, and first and second diffusion terminals. In an embodiment of the present invention, the first and second diffusion terminals are source and drain terminals, respectively. It is well known in the art that the first and second diffusion terminals may be drain and source terminals, respectively. The gate terminals of the first and the second transistors 702a and 702b are connected to the first word line 704a and the gate terminals of the third and fourth transistors 702c and 702d are connected to the second word line 704b. The first diffusion terminals of the first through fourth transistors 702a-702d are connected to the ground line 710. The second diffusion terminal of the first transistor 702a is connected to the first bit line 706a for storing the first and second data values in the first memory cell M1. The second diffusion terminal of the second transistor 702b is connected to the second source line 708b for storing the third and fourth data values in the second memory cell M2. The second diffusion terminal of the third transistor 702c is connected to the second bit line 706b for storing the fifth and sixth data values in the third memory cell M3. The second diffusion terminal of the fourth transistor 702d is floating for storing the seventh and eighth data values in the fourth memory cell M4. In an example, the first, third, fourth, and sixth data values correspond to logic zero and the second, fifth, seventh, and eighth data values correspond to logic one. Each mux 714 has first and second input terminals, a select terminal, and an output terminal. The first and second input terminals of the first mux 714a are connected to the first and third bit lines 706a and 706c. The first and second input terminals of the second mux 714b are connected to the first and second source lines 708a and 708b. The first and second input terminals of the third mux 714c are connected to the second and the fourth bit lines 706b and 706d. Each AND gate 716 has first and second input terminals, and an output terminal. The first and second input terminals of the first AND gate 716a are connected to the output terminals of the first and second muxes 714a and 714b, respectively. The first and second input terminals of the second AND gate 716b are connected to the output terminals of the second and third muxes 714b and 714c, respectively. It will be apparent to those skilled in the art that when the sensing unit 715 includes NAND gates instead of the AND gates 716, the first, third, fourth, and sixth data values correspond to logic one and the second, fifth, seventh, and eighth data values correspond to logic zero. Thus, the sensing unit 715 determines the logic value of the first, second, third, fourth, fifth, sixth, seventh, and eighth data values.

In an example, a word includes two data values. The first and second data values form a first word. The third and fourth data values form a second word. The fifth and sixth data values form a third word. The seventh and eighth data values form a fourth word. In operation, for reading the first word, a processor (not shown) generates and provides a binary address of the first word to an address decoding unit (not shown). The addressing decoding unit identifies the first and second bit lines 706a and 706b, the first source line 708a, and the first word line 704a. The address decoding unit selects the first and second bit lines 706a and 706b, and the first source line 708a by way of the column multiplexing unit 712. A pre-charging unit (not shown) pre-charges the first and second bit lines 706a and 706b, and the first source line 708a to a first voltage level for a predefined time interval. As the first and second diffusion terminals of the first transistor 702a are connected to the ground line 710 and the first bit line 706a, the first bit line 706a is discharged to ground by way of the first transistor 702a. Since the second diffusion terminal of the first transistor 702a is not connected to either of the second bit line 706b and the first source line 708a, the second bit line 706b and the first source line 708a are not discharged to ground. The address decoding unit further generates a select signal at logic low state based on the binary address of the first word. (It is well known in the art that the select signal may be generated at logic high state as well). The first, second, and third muxes 714a, 714b, and 714c receive the logic low select signal and select the first bit line 706a, the first source line 708a, and the second bit line 706b to generate first, second, and third output signals, respectively. The first mux 714a outputs the first output signal at logic low state. The second and third muxes 714b and 714c output the second and third output signals at logic high state. The first AND gate 716a receives the logic low first output signal and the logic high second output signal, and outputs the first data value as logic zero. The second AND gate 716b receives the logic high second and third output signals and outputs the second data value as logic one. Similarly, when the address decoding unit generates the select signal at logic high state, the second word is read. The read operation for reading the third and fourth words is performed in a similar manner.

Figure 8:
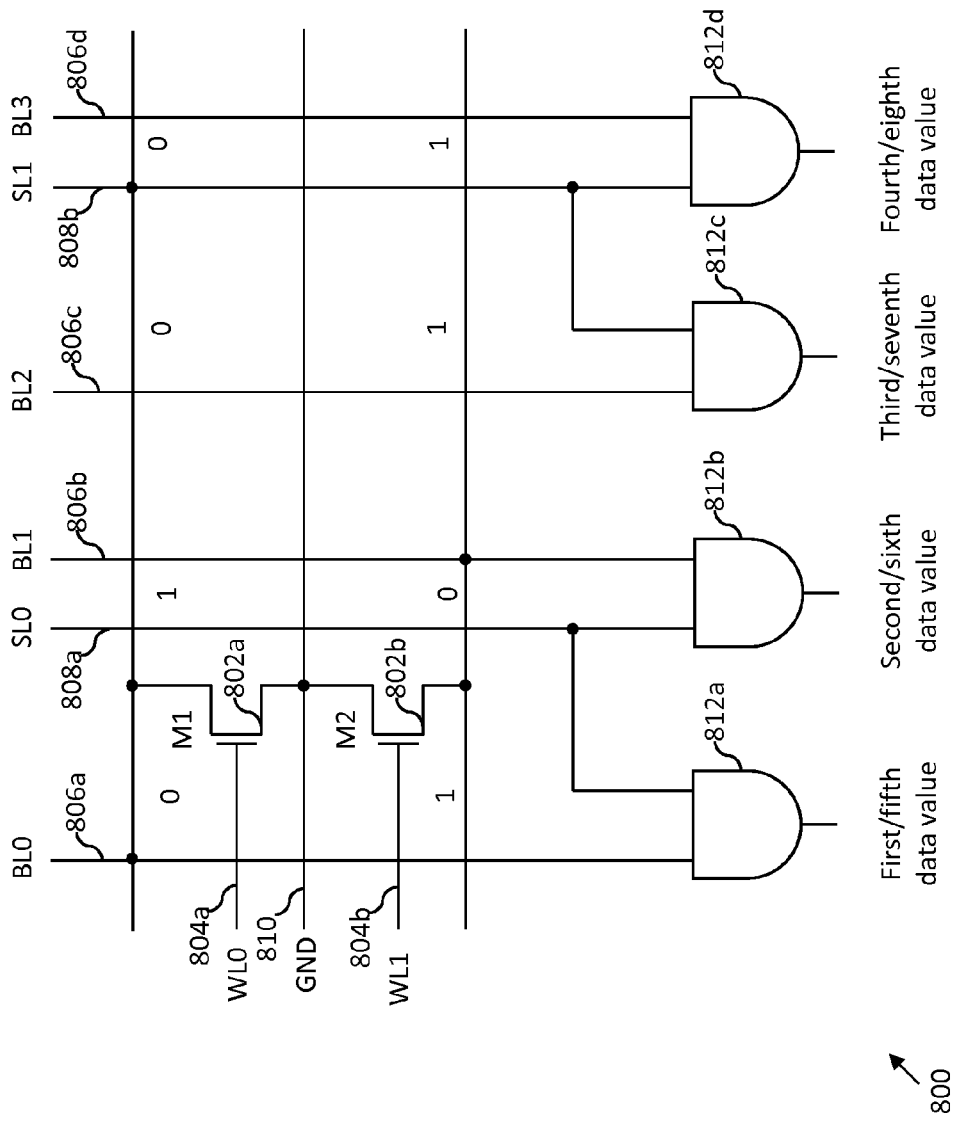
FIG. 8 is a schematic circuit diagram of a 2×4 ROM array in accordance with an embodiment of the present invention.

Referring to FIG. 8, a schematic circuit diagram of a ROM array 800 in accordance with yet another embodiment of the present invention is shown. The ROM array 800 is a 2×4 ROM array and includes first and second transistors 802a and 802b (collectively referred to as transistors 802), first and second word lines 804a and 804b (collectively referred to as the word lines 804), first through fourth bit lines 806a-806d (collectively referred to as bit lines 806), first and second source lines 808a and 808b (collectively referred to as source lines 808), a ground line 810, and a sensing unit 811. The sensing unit 811 includes first through fourth gates 812a-812d. The first and second transistors 802a and 802b form first and second memory cells M1 and M2, respectively, and are configured to store first through fourth data values, and fifth through eighth data values, respectively. The first bit line 806a retrieves the first and fifth data values. The second bit line 806b retrieves the second and sixth data values. The third bit line 806c retrieves the third and seventh data values. The fourth bit line 806d retrieves the fourth and eighth data values. The first source line 808a retrieves the first, second, fifth, and sixth data values. The second source line 808b retrieves the third, fourth, seventh, and eighth data values. The first through fourth gates 812a-812d are AND gates 812a-812d (collectively referred to as AND gates 812). The sensing unit 811 may include NAND, NOR, XOR, NOT, and XNOR gates.

Each transistor 802 has a gate terminal, and first and second diffusion terminals. In an embodiment of the present invention, the first and second diffusion terminals are source and drain terminals. It is well known in the art that the first and second diffusion terminals may be drain and source terminals, respectively. The gate terminals of the first and the second transistors 802a and 802b are connected to the first word line 804a and the second word line 804b, respectively. The first diffusion terminals of the first and second transistors 802a and 802b are connected to the ground line 810. The second diffusion terminal of the first transistor 802a is connected to the first bit line 806a and the second source line 808b for storing the first through fourth data values in the memory first cell M1. The second diffusion terminal of the second transistor 802b is connected to the second bit line 806b for storing the fifth through eighth data values in the second memory cell M2. In an example, the first, third, fourth, and sixth data values correspond to logic zero and the second, fifth, seventh, and eighth data values correspond to logic one. Each AND gate 812 has first and second input terminals, and an output terminal. The first and second input terminals of the first AND gate 812a are connected to the first bit line 806a and the first source line 808a, respectively. The first and second input terminals of the second AND gate 812b are connected to the first source line 808b and the second bit line 806b, respectively. The first and second input terminals of the third AND gate 812c are connected to the third bit line 806c and the second source line 808b, respectively. The first and second input terminals of the fourth AND gate 812d are connected to the second source line 808b and the fourth bit line 806d, respectively. It will be apparent to those skilled in the art that when the sensing unit 811 includes NAND gates instead of the AND gates 812, the first, third, fourth, and sixth data values correspond to logic one and the second, fifth, seventh, and eighth data values correspond to logic zero. Thus, the sensing unit 811 determines the logic value of the first, second, third, fourth, fifth, sixth, seventh, and eighth data values.

In an example, a word includes four data values. The first through fourth data values form a first word. The fifth through eighth data values form a second word. In operation, for reading the first word, an external processor (not shown) generates and provides an address of the first word to an address decoding unit (not shown). The address decoding unit functions to identify the first through fourth bit lines 806a-806d, the first and second source lines 808a and 808b, and the first word line 804a. The address decoding unit selects the first through fourth bit lines 806a-806d, and the first and second source lines 808a and 808b by way of the column multiplexing unit (not shown). A pre-charging unit (not shown) pre-charges the first through fourth bit lines 806a-806d, and the first and second source lines 808a and 808b to a first voltage level for a predefined time interval. Thereafter, the address decoding unit selects the first word for a predefined time interval, which switches on the first transistor 802a. Since the first diffusion terminal of the first transistor 802a is connected to the ground line 810 and the second diffusion terminal of the first transistor 802a is connected to the first bit line 806a and the second source line 808b, the first bit line 806a and the second source line 808b are discharged to ground by way of the first transistor 802a. Since the second diffusion terminal of the first transistor 802a is not connected to the first source line 808a, and the second through fourth bit lines 806b-806d, the first source line 808a, and the second through fourth bit lines 806b-806d are not discharged to ground. The first AND gate 812a detects a low voltage on the first bit line 806a and a high voltage on the first source line 808a, and hence outputs the first data value as logic zero. The second AND gate 812b detects a high voltage on the first source line 808a and the second bit line 806b, and hence outputs the second data value as logic one. The third AND gate 812c detects a low voltage on the second source line 808b and a high voltage on the third bit line 806c, and hence outputs the third data value as logic zero. The fourth AND gate 812d detects a low voltage on the second source line 808b and a high voltage on the fourth bit line 806d, and hence outputs the fourth data value as logic zero. The read operation for reading the second word is performed in a similar manner.

Thus, as a single memory cell stores multiple data values in the aforementioned embodiments of the present invention, the storage capacity of the ROM array is significantly improved. Further, the number of memory cells in the ROM array may be reduced, thereby reducing the process variations. As a result, the overall performance of the memory device improves with improved timing margins and read access time. The use of via programming for storing data values in the memory device also reduces time-to-market of the memory device.

In an embodiment of the present invention, the first through fourth transistors are n-channel metal-oxide semiconductor (NMOS) transistors. In another embodiment of the present invention, the first through fourth transistors are p-channel metal-oxide semiconductor (PMOS) transistors.

It will be understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It should be understood that, although the terms first, second, etc. and horizontal and vertical are used to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A memory device, comprising:
a plurality of memory cells including a corresponding plurality of transistors, including a first memory cell having a first transistor for storing first and second data values;
a plurality of word lines including a first word line for activating the first transistor;
a plurality of pairs of bit lines including a first pair of bit lines that correspond to the first transistor, wherein the first pair of bit lines includes first and second bit lines for retrieving the first and second data values, respectively; and
a plurality of source lines including a first source line that corresponds to the first transistor, wherein the first source line retrieves the first and second data values,
wherein the first transistor has a gate terminal connected to the first word line for receiving a word line enable signal, a first diffusion terminal connected to ground, and a second diffusion terminal connected to at least one of the first source line, and the first and second bit lines, for determining the first and second data values;
a first logic gate having first and second input terminals connected to the first bit line and the first source line, respectively, and an output terminal for outputting the first data value when the first bit line and the first source line are pre-charged to a first voltage level, and the first word line is activated; and
a second logic gate having first and second input terminals connected to the first source line and the second bit line, respectively, and an output terminal for outputting the second data value when the second bit line and the first source line are pre-charged to the first voltage level, and the first word line is activated.

2. The memory device of claim 1, wherein the first and second data values correspond to a first logic value when the second diffusion terminal is connected to the first source line, the first logic value and a second logic value, respectively, when the second diffusion terminal is connected to the first bit line, the second and first logic values, respectively, when the second diffusion terminal is connected to the second bit line, and the second logic value when the second diffusion terminal is floating.

3. The memory device of claim 2, further comprising:
a second memory cell of the plurality of memory cells including a corresponding second transistor of the plurality of transistors, wherein the second transistor for storing third and fourth data values;
a second pair of bit lines of the plurality of pairs of bit lines corresponding to the second transistor, wherein the second pair of bit lines includes first and second bit lines, and wherein the first and second bit lines of the second pair of bit lines retrieve the third and fourth data values, respectively; and
a second source line of the plurality of source lines corresponding to the second transistor, wherein the second source line retrieves the third and fourth data values,
wherein the second transistor has a gate terminal connected to the first word line for receiving the word line enable signal, a first diffusion terminal connected to ground, and a second diffusion terminal connected to at least one of the second source line, and the first and second bit lines of the second pair of bit lines, for determining the third and fourth data values, and
wherein the third and fourth data values correspond to the first logic value when the second diffusion terminal of the second transistor is connected to the second source line, the first and the second logic values, respectively, when the second diffusion terminal of the second transistor is connected to the first bit line of the second pair of bit lines, the second and first logic values, respectively, when the second diffusion terminal of the second transistor is connected to the second bit line of the second pair of bit lines, and the second logic value when the second diffusion terminal of the second transistor is floating.

4. The memory device of claim 3, wherein the first and second logic values each comprises at least one of logic zero and logic one.

5. The memory device of claim 3, further comprising a column multiplexing unit connected to the first and second pairs of bit lines and the first and second source lines for receiving the first, second, third, and fourth data values, and an external select signal, and for outputting the first and second data values when the select signal is at a first logic state, and the third and fourth data values when the select signal is at a second logic state.

6. The memory device of claim 1, wherein when the first source line, and the first pair of bit lines are pre-charged to a first voltage level, the first word line is activated for reading the first and second data values.

7. The memory device of claim 1, wherein the first and second logic gates each comprises at least one of an AND gate, an OR gate, an XOR gate, a NOT gate, and an XNOR gate.

8. A memory device, comprising:
a plurality of memory cells including a corresponding plurality of transistors, wherein a first memory cell includes a first transistor for storing first, second, third, and fourth data values;
a plurality of word lines including a first word line for activating the first transistor;
a plurality of pairs of bit lines including first and second pairs of bit lines that correspond to the first transistor, wherein the first and second pairs of bit lines include first and second bit lines, and third and fourth bit lines, respectively, and wherein the first, second, third, and fourth bit lines are for retrieving the first, second, third, and fourth data values, respectively; and
a plurality of source lines including first and second source lines that correspond to the first transistor, wherein the first and second source lines are for retrieving the first and second data values, and the third and fourth data values, respectively, and
wherein the first transistor has a gate terminal connected to the first word line for receiving a word line enable signal, a first diffusion terminal connected to ground, and a second diffusion terminal connected to at least one of the first source line, the second source line, the first bit line, the second bit line, the third bit line, and the fourth bit line, for determining the first, second, third, and fourth data values,
wherein the first and second data values correspond to a first logic value when the second diffusion terminal is connected to the first source line, the first logic value and a second logic value, respectively, when the second diffusion terminal is connected to the first bit line, the second and first logic values, respectively, when the second diffusion terminal is connected to the second bit line, and the second logic value when the second diffusion terminal is floating.

9. The memory device of claim 8, wherein the third and fourth data values correspond to the first logic value when the second diffusion terminal is connected to the second source line, the first and second logic values, respectively, when the second diffusion terminal is connected to the third bit line, the second and first logic values, respectively, when the second diffusion terminal is connected to the fourth bit line, and the second logic value when the second diffusion terminal is floating.

10. The memory device of claim 9, wherein the first and second logic values each comprises at least one of logic zero and logic one.

11. The memory device of claim 8, wherein the first and second source lines, and the first and second pairs of bit lines are pre-charged to a first voltage level, and the first word line is activated for reading the first and second data values from the first source line and the first pair of bit lines, and the third and fourth data values from the second source line and the second pair of bit lines.

12. The memory device of claim 8, further comprising:
a first logic gate having first and second input terminals connected to the first bit line and the first source line, respectively, and an output terminal for outputting the first data value when the first bit line, and the first source line are pre-charged to a first voltage level, and the first word line is activated;
a second logic gate having first and second input terminals connected to the first source line and the second bit line, respectively, and an output terminal for outputting the second data value when the second bit line and the first source line are pre-charged to the first voltage level, and the first word line is activated;
a third logic gate having first and second input terminals connected to the third bit line and the second source line, respectively, and an output terminal for outputting the third data value when the third bit line and the second source line are pre-charged to the first voltage level, and the first word line is activated; and
a fourth logic gate having first and second input terminals connected to the second source line and the fourth bit line, respectively, and an output terminal for outputting the fourth data value when the fourth bit line and the second source line are pre-charged to the first voltage level, and the first word line is activated.

13. The memory device of claim 12, wherein the first, second, third, and fourth logic gates each comprises at least one of an AND gate, an OR gate, an XOR gate, a NOT gate, and an XNOR gate.

14. The memory device of claim 8, wherein the first transistor comprises at least one of an n-channel metal-oxide semiconductor (NMOS) transistor and a p-channel metal-oxide semiconductor (PMOS) transistor.

15. A memory device layout, comprising:
a plurality of active regions formed in a semiconductor substrate, wherein a first active region includes first and second diffusion regions;
a plurality of gate electrode strips including a first gate electrode strip formed over the first active region, wherein the first gate electrode strip, and the first and second diffusion regions form a first transistor, and wherein the first transistor stores first and second data values;
a first metal strip connected to the first gate electrode strip, wherein the first gate electrode strip receives a first voltage signal by way of the first metal strip for reading the first and second data values;
a second metal strip connected to ground and the first diffusion region, wherein the first diffusion region is connected to ground by way of the second metal strip;
a third metal strip connected to the second diffusion region; and
fourth, fifth, and sixth metal strips, wherein the second diffusion region is connected to at least one of the fourth, fifth, and sixth metal strips by way of the third metal strip for receiving a second voltage signal, for determining the first and second data values.

16. The memory device of claim 15, wherein the first and second data values correspond to a first logic value when the second diffusion region is connected to the fifth metal strip, a second logic value and the first logic value, respectively, when the second diffusion region is connected to the sixth metal strip, the first and second logic values, respectively, when the second diffusion region is connected to the fourth metal strip, and the second logic value when the second diffusion region is floating.

17. The memory device of claim 16, wherein the first and second logic values each comprises at least one of logic zero and logic one.

* * * * *